United States Patent [19] [11] 4,090,136
Magnien et al. [45] May 16, 1978

[54] METHOD AND APPARATUS FOR CODING A SIGNAL

[75] Inventors: Christian Magnien, Perros-Guirec; Fernand Secher, Lannion, both of France

[73] Assignee: Societe Lannionnaise d'Electronique Sle-Citerel S.A., Lannion, France

[21] Appl. No.: 653,639

[22] Filed: Jan. 29, 1976

[30] Foreign Application Priority Data

Feb. 28, 1975 France .............................. 75 06395

[51] Int. Cl.² .......................................... H03K 13/22
[52] U.S. Cl. .............................. 325/38 B; 332/11 D; 340/347 AD
[58] Field of Search ....................... 325/145, 45, 38 B; 332/11 D; 340/347 AD, 347 SY; 235/150.5

[56] References Cited

U.S. PATENT DOCUMENTS

| 3,339,142 | 8/1967 | Varsos | 325/38 B |
| 3,879,663 | 4/1975 | McGrogan, Jr. | 325/38 B |
| 3,908,181 | 9/1975 | Shigaki et al. | 325/38 B |

Primary Examiner—Robert L. Griffin
Assistant Examiner—Marc E. Bookbinder
Attorney, Agent, or Firm—Haseltine, Lake & Waters

[57] ABSTRACT

The invention relates to the coding of analog signals. An analog signal is compared with a comparison signal increasing according to a given law, until equality with the analog signal is reached; then, the comparison signal remains constant during a predetermined time and resumes its original value. The transmission device includes a processing circuit at the transmission end and at the receiving end; at the transmission end, the processing circuit is preceded by a comparator receiving the analog signal, and the comparison signal supplied by a converter is fed thereto by the processing circuit; at the receiving end, the signal to be decoded is supplied to a forming circuit connected to the input of the processing circuit. The present invention is applicable to data transmission and to telephony in particular.

7 Claims, 10 Drawing Figures

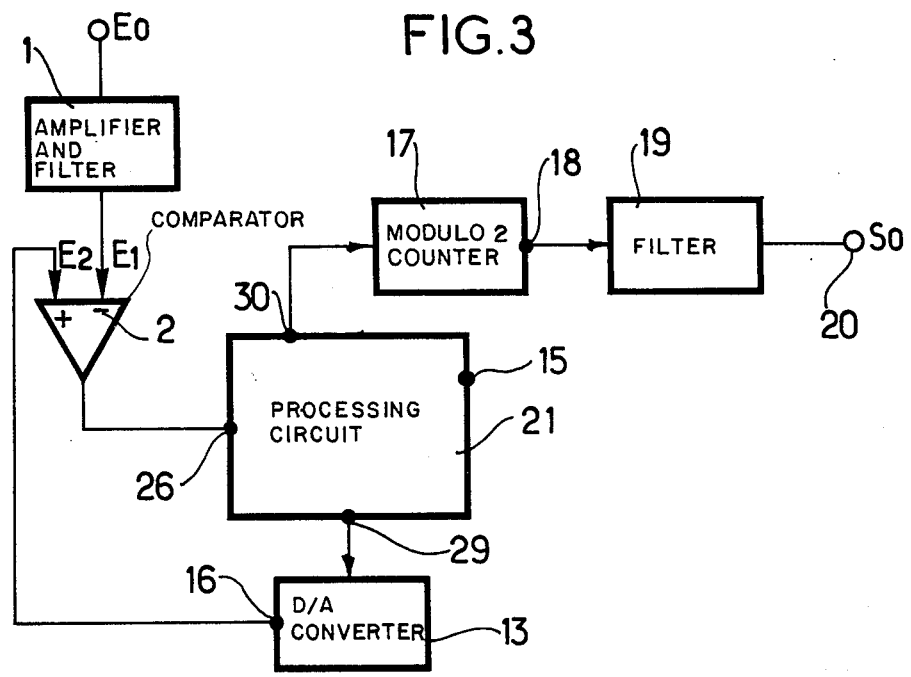
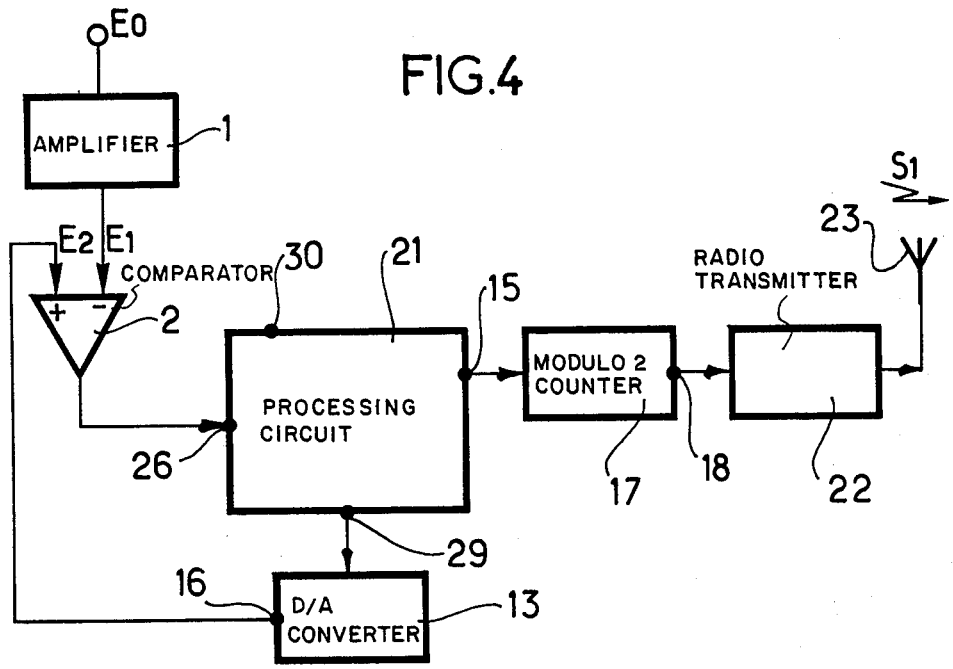

METHOD AND APPARATUS FOR CODING A SIGNAL

The present invention concerns the coding and decoding of analog signals, and more particularly of speech signals. Various coding methods and devices are known, such as, for example, pulse code modulation systems, phase modulation systems, frequency modulation systems, and pulse duration modulation systems. These various well-known methods and systems have their advantages and their disadvantages; more particularly, they are not insensitive to noise and do not ensure secrecy in the transmission of the signals, for the analyzing and the decoding thereof do not afford any significant difficulties such that it would be impossible to reconstitute the original signal.

The present invention has as its object a method for coding analog signals ensuring excellent immunity to noise and the provision of relative secrecy in the transmission of the analog signals.

The invention also has as its object a transmitting device implementing the coding method and including a transmission or coding portion, and a receiving or decoding portion.

The method for coding an analog signal is characterized by the analog signal being compared with a comparison signal which increases according to a given law from an original value until equality with the analog signal is reached, by the comparison signal subsequently remaining constant during a predetermined time and by it resuming after that time, its original value, by a signal resulting from the comparison with a memory assuming a first constant value as long as the equality between the analog signal and comparison signal has not been reached and by the signal assuming a second constant value, as soon as equality is reached, the second value being retained during the whole time when the comparison signal is constant, and by a rectangular signal being generated by counting, modulo two, the time change of the memory from the second value to the first value.

The transmitting or encoding device for implementing the coding method includes a transmission or coder part and a receiving or decoder part is characterized by the transmission or encoding part and the receiving decoding part each including an identical processing circuit, constituted by a clock, signal generator, a memory, switching circuit, first and second counters, the switching circuit having first and second inputs, and first and second outputs, the first input being connected to an output of the memory, one of the memory's inputs being an input from the processing circuit, the second input being connected to the clock signal generator, the first output being connected to the first counter, the second output being connected to the second counter, the second counter having an output connected to the memory and the first and second counters for resetting them to zero, the processing circuit having outputs constituted by an output of the first and second counters, and by the output of the memory, the second counter counting a predetermined number of signals.

According to another characteristic of the invention, the transmission or coder part additionally includes a comparator, a digital-to-analog converter, a modulo two counter and a filter, the comparator having its output connected to the input of the memory, and receiving on a first input thereof an analog signal, and on a second input thereof an analog comparison signal leaving from the digital-to-analog converter, the latter being connected to the output of the first counter, the output of the second counter, being connected to the modulo two counter whose output is connected to the filter, which furnishes, at its output, a coded analog signal.

According to another characteristic of the invention, the receiving or decoding part additionally includes a forming or shaping circuit receiving, at its input, a signal to be decoded, its output being connected to the input of the memory of the processing circuit, a digital-to-analog converter whose input is connected to the output of the first counter of the processing circuit, an amplifying and filtering circuit whose input is connected to the output of the digital-to-analog converter and which supplies, at the output, a decoded analog signal.

Other characteristics and advantages of the invention will become apparent from the following description of examples of embodiments illustrated by the accompanying figures, in which:

FIG. 3 shows a variant of the embodiment of the transmission or encoder part;

FIG. 4 shows another variant of the embodiment of the transmission or encoder part;

Figure 1:
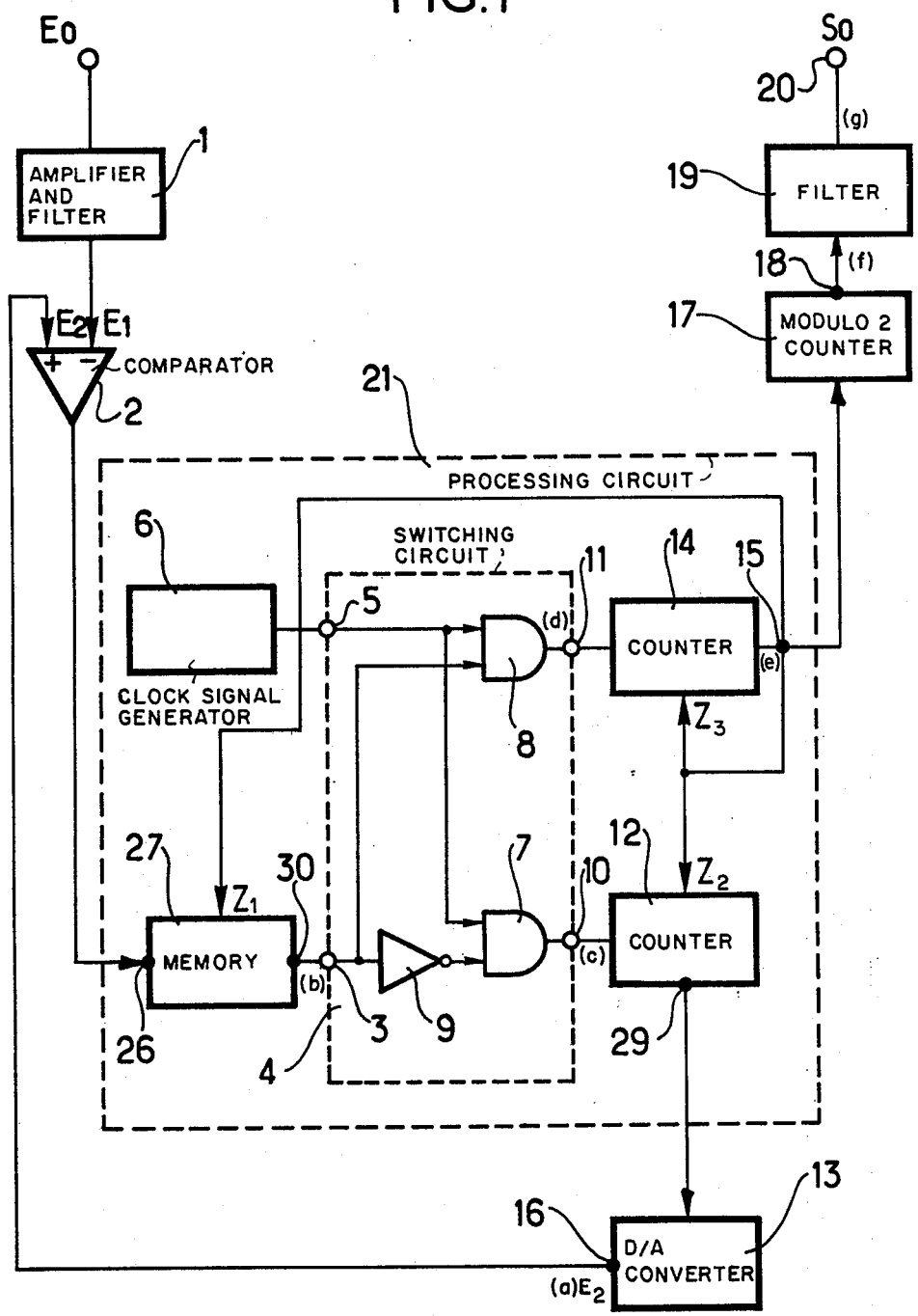
FIG. 1 shows an example of an embodiment of the transmission or encoder part of a transmitting device.

FIG. 1 shows an example of an embodiment of the transmission or coder part of a transmission device, according to the present invention, in the case of its application to telephony. In that figure, an analog signal $E_0$, which is to be coded, is applied to an amplifying and filtering circuit 1, at whose output there appears an analog signal $E_1$, the output of the filtering circuit 1 being connected to an input of a comparator 2; the output of the comparator 2 is connected to the input 26 of a memory 27, whose output 30 is connected to a first input 3 of a switching circuit 4, which includes a second input 5 connected to a clock signal generator 6 furnishing square waveform signals at a frequency F. The switching circuit 4 includes two AND gates 7 and 8, and a logic converter 9, the AND gates 7 and 8 each having an input connected to the second switch circuit input 5. The AND gate 8 has another input connected to the first switch circuit input 3 and the first switch circuit input 3 is also connected to the logic inverter 9, whose output is connected to another input of the AND gate 7. The first and second outputs 10 and 11 of the switch circuit 4 are constituted respectively, by the outputs of the AND gates 7 and 8. The first switch circuit output 10 is connected to a first counter 12 whose output 29 is connected to a digital-to-analog converter 13; the second switch circuit output 11 is connected to a second counter 14 whose output 15 is connected to a plurality of inputs $Z_1$, $Z_2$ and $Z_3$ of the memory 27, and each of the first and second counters, respectively, for setting the memory and the counters to zero. The output 16 of the digital-to-analog converter 13, which furnishes an analog comparison signal E2 is connected to another input of the comparator 2. The clock signal generator 6, the switch circuit 4, the first counter 12, the second counter 14, the memory 27 and their connections constitute a processing circuit 21, an identical replica of which will be found in the decoder of the receiving part of the transmitting or encoding device, to be discussed later.

Figure 8:
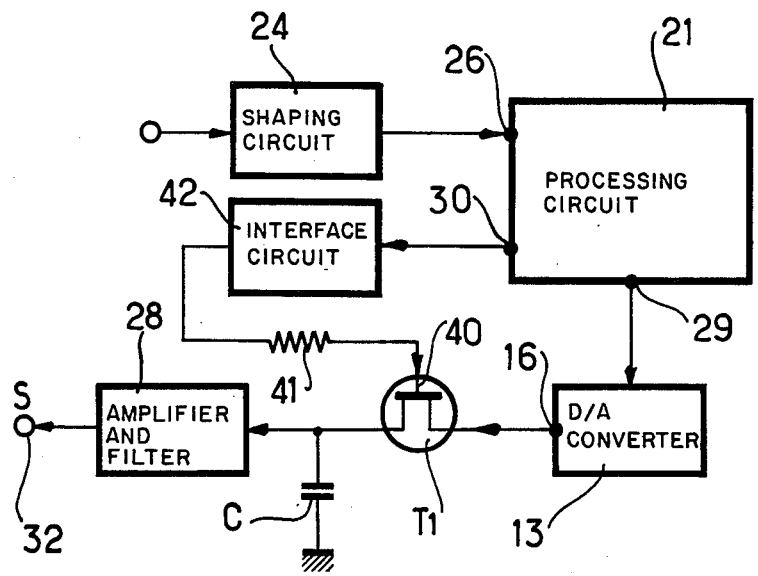
FIG. 8 shows another variant of the embodiment of the receiving or decoder part.

The processing circuit includes an input 26 which is that of the memory 27, an output 15 of the counter 14, an output 29 of the counter 12 and an output 30 of the memory 27, whose function will be specified during description of FIGS. 3 and 8.

The output 15 of the second counter 14 is connected to the input of a modulo two counter 17, whose output 18 is connected to a filter 19 which furnishes at its output 20 a coded analog signal So, the filter 19 having, for example, a pass band of 300 to 3000 c/s.

Figure 2:
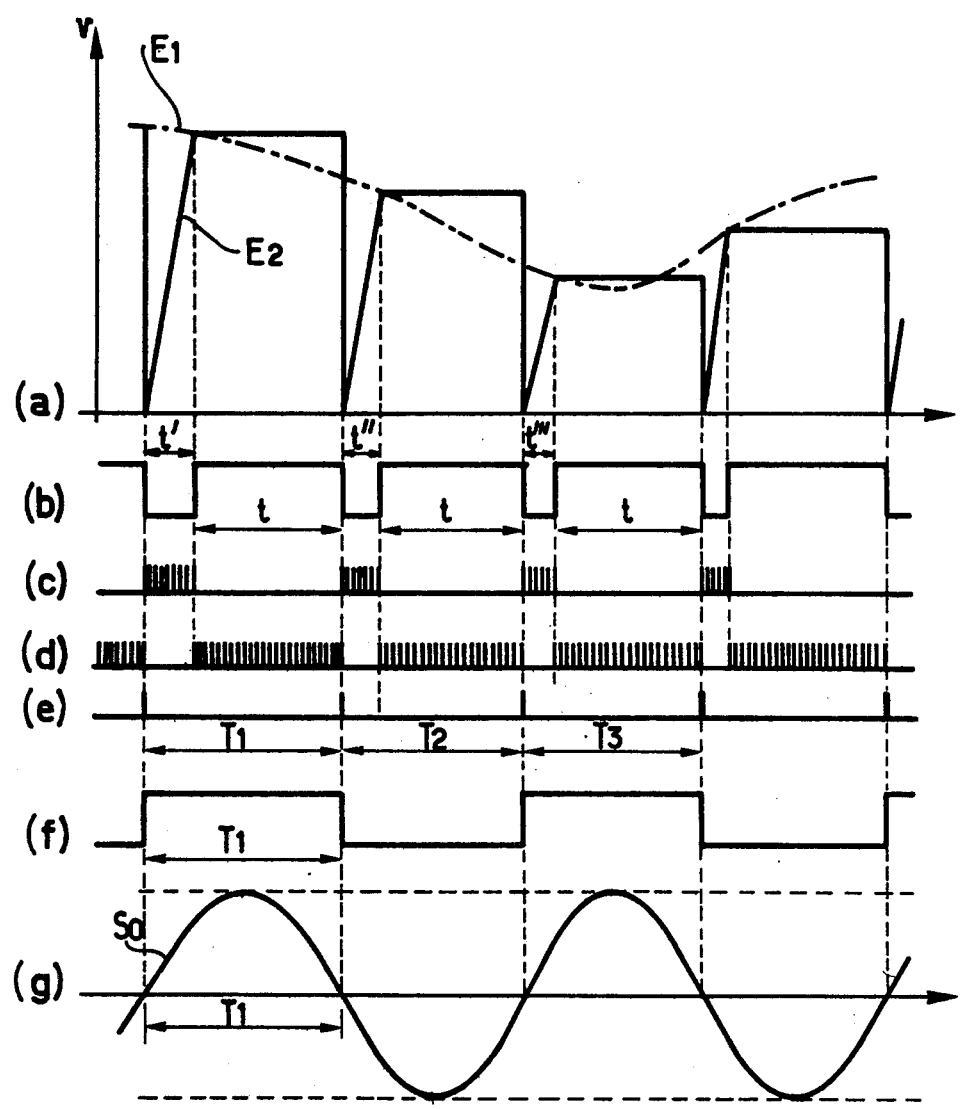
FIG. 2 shows the signal waveforms at various points of the transmission or encoder part in FIG. 1.

FIG. 2 shows, as a function of time, the form of the signal waveforms obtained at various points of FIG. 1.

The waveform a shows the analog signal E1 in dash-dot lines applied to the comparator 2, and the analog comparison signal E2 in full lines furnished by the digital-to-analog converter 13, and applied to the comparator 2;

The waveform b shows the signal obtained at the output 30 of of the memory 27 and supplied to the first input 3 of the switch circuit 4.

The waveform c shows the signal obtained at the first output 10 of the switch circuit 4;

The waveform d shows the signal obtained at the second output 11 of the switch circuit 4;

The waveform e shows the signal obtained at the output 15 of the second counter 14;

The waveform f shows the signal obtained at the output 18 of the modulo two counter 17; and The waveform g shows the analog coded signal So leaving the filter 19.

The operation of the transmission or encoder part shown in FIG. 1 is as follows. The analog signal Eo, which is, for example, a speech signal, is applied to the amplifying and filtering circuit 1, which furnishes an analog signal E1 to the comparator 2. That analog signal E1 is compared with an analog comparison signal E2 supplied by the digital-to-analog converter 13; as long as the analog signal E1 is greater than the analog comparison signal E2, the comparator 2 does not furnish any signal to the memory 27, the first input 3 of the switch 4 receiving a signal "0," the logic inverter 9 supplying a signal "1" to the AND gate 7, which also receives the signals from the clock signal generator 6. The first counter 12 therefore receives the clock signals, which are square waveform signals having a frequency F, counts them and permanently transmits the indication of the counting to the digital-to-analog converter 13, which supplies, at its output 16, the analog comparison signal E2, which therefore increases as a function of time, since it is a function of the number of clock signals received by the first counter; the analog comparison signal E2 has therefore a staircase configuration, at the rate or rhythm of advance of the first counter.

When equality of the signals E1 and E2 is obtained, the comparator 2 sends out a signal "1" to the memory 27, which retains that signal and furnishes it to the first input 3 of the switch circuit 4, thus inhibiting the AND gate 7. On the other hand, the AND gate 8 receives the signal "1" from the memory 27, and becomes conductive; it then supplies "1" signals, to the second counter 14 at the rate or rhythm of the clock signal generator "1" signals. The second counter 14 counts those signals up to a certain predetermined number N. When that number N is reached, the second counter 14 furnishes a signal which is applied to the inputs $Z_2$, $Z_3$ and $Z_1$ for resetting to zero the first and second counters and the memory, respectively, which then return to zero. The analog comparison signal E2 also falls to zero, as does the signal at the output of the comparator 2, and the first counter 12 again receives the clock signal generator signals.

It will be seen from FIG. 2 — waveform b — that the signal leaving the memory 27 is zero during the intervals $t'$, $t''$, $t'''$ . . . etc., and equal to unity during other time intervals t, corresponding up to N counts of the second counter 14.

It will be seen from FIG. 2 — waveform e — that the signal supplied by the second counter 14, on its output 15, is constituted by pulses which correspond to the end of counting by the second counter, and hence to the return to zero of the analog comparison signal E2, as stated previously. The signal supplied by the second counter 14, on its output 15, is applied to a modulo two counter 17, which supplies rectangular signals shown in FIG. 2 — waveform f. Those rectangular signals are applied to the filter 19 having a pass band of 300–3000 c/s, which furnishes, at the output 20, the coded analog signal So shown in FIG. 2 — waveform g.

Calling F the frequency of the signals furnished by the clock signal generator 6, and T the time separating two operations of the first counter 12, T assuming the values $T1 = t + t'$, $T2 = t + t''$, $T3 = t + t'''$, . . . , the result obtained is: $t = N/F$ and $t' = n1/F$, $n1$ being the number counted by the first counter; likewise, $t'' = n2/F$, $t''' = n3/F$ and $T = (N + n)/F$, $n$ assuming the values $n1$, $n2$, $n3$, etc . . .

By way of an example, and taking $F = 2.86$ Mc/s, $N = 640$ and $n$max. $= 64$, that is, the maximum value to which the first counter can count, the result obtained is: $1/F = 0.35$ microseconds.

$t'$max. $= n$max./F $= 22.4$ microseconds; $n$min. $= 0$;
  $t'$min. $= 0$
$N/F = 224$ microseconds
$t + t'$ max. $= 246$ microseconds
$t + t'$ min. $= T$min. $= 224$ microseconds The frequency $f$ of the signal furnished by the modulo two counter 17, and shown in FIG. 6 by the waveform $f$ is variable; it is at least
  $f$ min. $= \frac{1}{2}T$max. $= 2030$ c/s
and at the most
  $f$ max. $= \frac{1}{2}T$min. $= 2230$ c/s.

That variable frequency $f$ is also that of the coded analog signal So shown on the waveform g in FIG. 2.

The sampling frequency $F_s$ of the analog signal E1 is shown as
  $F_s = 1/T$,
where $T = (N + n)/F$,
that frequency varying between
  $1/T$max. $= 4040$ c/s, and $1/T$min. $= 4430$ c/s.

FIG. 3 shows a variant of the transmission or encoder part of a transmitting device, according to the present invention, and the same reference numerals as those in FIG. 1 have the same significance. In that FIG. 3, the signal at the output 30 of the memory 27 and shown in FIG. 2 — waveform b, is applied to the modulo two counter 17, which is followed by the filter 19 which furnishes at its output an analog coded signal So identical to that of FIG. 2 — waveform g, the modulo two counter 17 changing states on descending wave fronts of the signals leaving the memory 27.

FIG. 4 shows another variant of the transmission or encoder part of a transmitting or encoding device according to the present invention, and the same reference numerals as those in FIG. 1 have the same significance. In that FIG. 4, the signal at the output 18 of the modulo two counter 17, which is shown in FIG. 2 as waveform f, is applied to a wireless or radio transmitter 22, which transmits, through its aerial or antenna 23, a coded radio signal S1. The signal leaving the modulo two counter 17 is used for modulating a carrier wave of the wireless transmitter 22.

It has been stated that an amplifying and filtering circuit receiving the analog signal Eo, which is, moreover, not necessarily a speech signal, was used; of course, according to the characteristics of the analog signal Eo, and of the transmission means, which is a line in the case of a connection by wires and more particularly a telephone line, and a radio link in the case of transmission by a wireless transmitter, the amplifying and filtering circuit 1 may not be needed, or include only one amplifier, if necessary. Moreover, no hypothesis has been made concerning the analog signal Eo and that signal can, for example, be a speech signal, or any other analog signal having, or not having, previously been processed. Consequently, it is immaterial how the analog signal Eo has been obtained, for this is not a part of the present invention.

Figure 5:
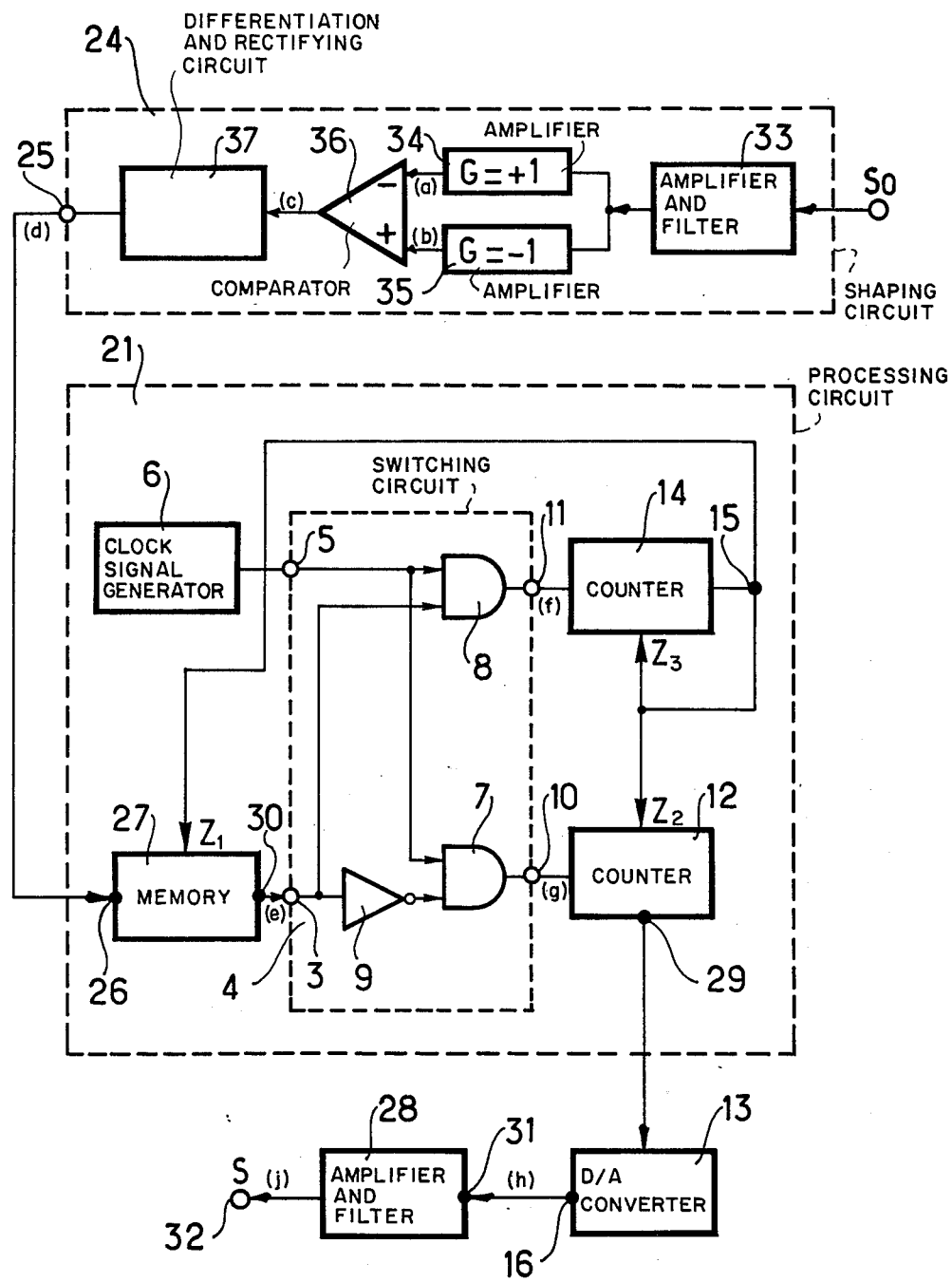
FIG. 5 shows an example of an embodiment of the receiving or decoder part.

FIG. 5 shows an example of an embodiment of the receiving or decoding part of the transmission device, according to the invention, which includes a forming circuit 24, a processing circuit 21 identical to the processing circuit in FIG. 1, a digital-to-analog converter 13, and an amplifying and filtering circuit 28.

In that figure, an analog signal So furnished by the transmission or encoding part shown in FIGS. 1 or 3, is applied to the input of the forming or shaping circuit 24 whose output 25 is connected to the input 26 of the memory 27 of the processing circuit 21, which is in turn connected by its output 29, this being also the output of the first counter 12, to the digital-to-analog converter 13, whose output 16 is in turn connected to the input 31 of the amplifying and filtering circuit 28, which furnishes, at its output, a decoded analog signal S having the same form as the analog signal E1 of the transmission or encoding part.

The forming or shaping circuit 24 includes an amplifying and filtering circuit 33 which receives, at its input, the analog signal So, two amplifiers 34 and 35 having a gain of G = 1 and G = −1, respectively, whose inputs are in turn connected to the output of the amplifying and filtering circuit 33; the output of each amplifier is connected to the input of a comparator 36, whose output is connected to the input of a differentiation and rectifying circuit 37, whose output 25 constitutes the output of the forming or shaping circuit 24.

Figure 6:
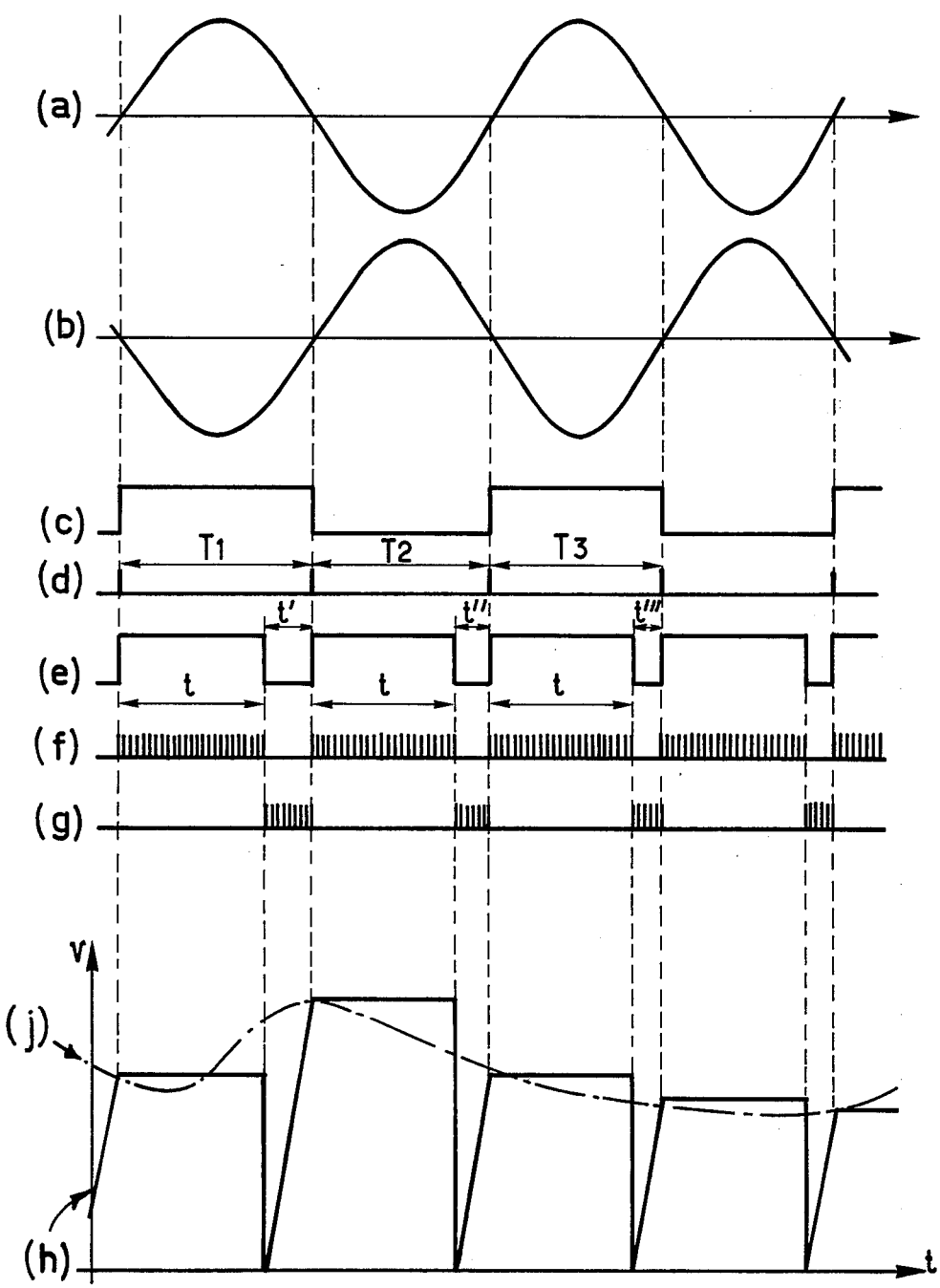
FIG. 6 shows signal waveforms at various points of the receiving or decoder part in FIG. 5.

FIG. 6 shows the waveforms at various points of FIG. 5.

Waveform a shows the signal leaving the amplifier 34;

Waveform b shows the signal leaving the amplifier 35;

Waveform c shows the signal at the output of the comparator 36;

Waveform d shows the signal at the output 25 of the forming circuit 24;

Waveform e shows the signal at the output 30 of the memory 27;

Waveform f shows the signal at the output 11 of the switching circuit 4;

Waveform g shows the signal at the output 10 of the switching circuit 4;

Waveform h shows the signal at the output 16 of the digital-to-analog converter; and Waveform j shows the smoothed output of the amplifier and filter 32.

The receiving part shown in FIG. 5 operates as follows:

The analog coded signal So is applied to the input of the amplifying and filtering circuit 33 which transmits a signal in parallel to the two amplifiers 34 and 35. The signal leaving each amplifier 34 and 35 is applied to the input of the comparator 36 whose output supplies a signal to the differentiation and rectifying circuit 37, which in turn supplies, at the output 25, a pulse signal shown in FIG. 6 as waveform d. These pulses correspond to each rising and descending wave front of the signal transmitted by the comparator 36, that signal being constituted by square waveform pulses shown in FIG. 6 by the waveform c. Each rising or descending front corresponds to a pass through zero of the waveforms a and b in FIG. 6; these waveforms are derived from the coded analog signal So after having passed the amplifying and filtering circuit 33, which does not change the position of the zero crossings of the coded analog signal So. The pulse signal is applied to the input 26 of the memory 27 of the processing circuit 21; due to the effect of a pulse of the pulse signal, that memory assumes the state "1," and retains that state after the disappearance of the pulse; the output 30 of the memory 27 furnishes a signal "1" to the input 3 of the switching circuit 4; that signal "1" controls the AND gate 8 which transmits to the second counter 14 the clock signals, which are square waveform signals having a frequency of F.

The second counter 14 counts these square signals up to the number N, which is the same as that of the transmission; when it has finished counting, it transmits, at the output 15, a signal which is applied to the inputs $Z_2$, $Z_3$ and $Z_1$ of the first and second counters 12 and 14 and the memory 27, respectively, for resetting those counters and the memory to zero. The output signal 30 of the memory 27 is therefore "0;" the AND gate 8 is inhibited and the AND gate 7 is unblocked by the inverter 9, the output 10 of the AND gate 7 transmitting the clock signals to the first counter 12, which counts the clock signals. When a new pulse is applied to the input 26 of the memory 27, the latter again transmits a signal "1;" the AND gate 7 is then inhibited, and the first counter 12 stops counting. On the other hand, the second counter 14 receives again the clock signals and counts them, as stated previously.

The waveform e in FIG. 6 shows the form of the signals at the output 30 of the memory 27; of course, the time t which corresponds to the counting time of the second counter 14 is less than the time which separates two pulses at the input of the memory 27. The counting time t is equal to the counting time of the first counter 12 of the transmission or encoding part which effects the coding of the analog signal E1.

The waveforms f and g in FIG. 6 show, respectively, the form of the signals at the outputs 11 and 10 of the AND gates 8 and 7. The state of the first counter 12 is transmitted permanently by its output 29 to the digital-to-analog converter 13. When that first counter counts, this corresponding to the instants t', t'', t''' of the waveform e in FIG. 6, the signal at its output 29 increases steadily, and the signal at the output 16 of the digital-to-analog converter 13 also increases steadily, as shown by the waveform h in FIG. 6. When the first counter 12 stops counting, the signal at its output 29 has a constant value which depends on the counting time t', t'', t'''; and the signal at the output 16 of the digital-to-analog converter 13 assumes a constant value during the whole counting time t of the counter 14, that value corresponding to the value obtained at the end of counting of the first counter.

When the second counter 14 stops counting, it resets the first counter 12 to zero, as stated previously, and the signal at the output 16 of the digital-to-analog converter 13 assumes the value zero, and the process begins again by the counting of the clock signals by the first counter 12.

The signal leaving the digital-to-analog converter 13 is amplified and filtered by the amplifying and filtering circuit 28, which transmits, at its output 32, a decoded analog signal S having the same form as the analog signal E1 applied to the comparator 2 of the transmission or encoding part of the device. The amplitude of the decoded analog signal S depends, of course, on the gain of the amplifying and filtering circuit 28.

The processing circuits 21 of the transmission or encoding, and receiving or decoding portions includes the same elements, as has already been stated. In the description of the receiving or decoding part, it has been assumed that the frequency F of the clock signal generator 6 and the number N counted by the counter 14 were identical to the frequency F and to the number N of the transmission, or encoding part, respectively; of course, there can be another clock frequency F1, and another number N1, provided that the ratio N1/F1 is equal to the ratio N/F, so that the counting time t is the same at the transmission, or encoding end, and at the decoding or receiving end; it is also necessary, both at the transmission or encoding end and at the receiving, or decoding end, for the maximum counting capacity of the first counter 12 to be sufficient to count the clock signals during such times such as t', t'', t''', which are independent of the clock frequency.

Figure 7:
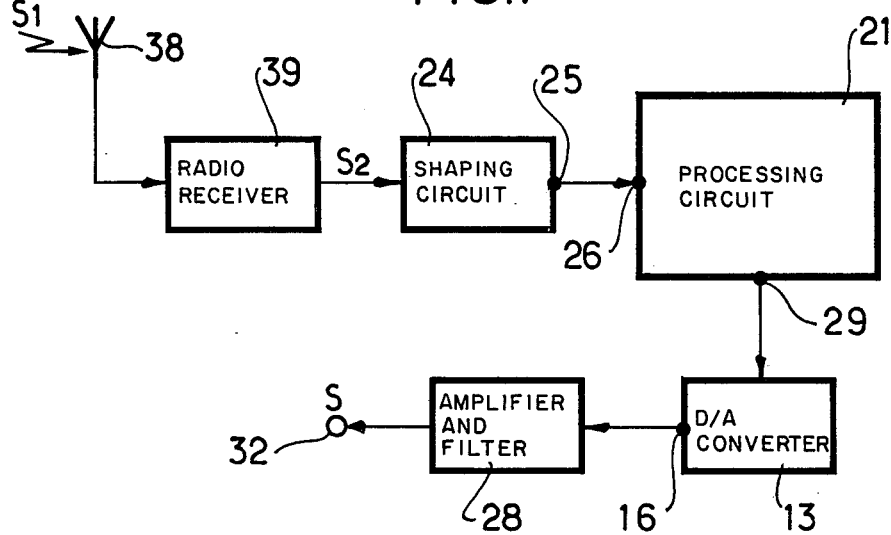
FIG. 7 shows a variant of the embodiment of the receiving or decoder part.

In the case where the transmission or encoding part includes a wireless transmitter, as shown in FIG. 4, the receiving part also includes a wireless receiver, as shown in FIG. 7. In FIG. 7, an antenna or aerial 38 receives the coded wireless signal S1 transmitted by the wireless transmitter 22 of the transmission part; that aerial 38 is connected to a wireless or radio receiver 39 connected to a forming or shaping circuit 24 identical to that of FIG. 5. The wireless receiver transmits an analog signal S2 comparable to the coded analog signal So in FIG. 5. A processing circuit 21, a digital-to-analog converter 13 and an amplifying and filtering circuit 28, at whose output 32 a decoded analog signal S is obtained, are shown again in FIG. 7, as well as in FIG. 5.

In the examples of embodiment of the receiving or decoding part in FIGS. 5 and 7, the signal applied to the input of the amplifying and filtering circuit 28 has positive-going portions, followed by periods where the signal returns to zero, as can be seen on the waveform h in FIG. 6. These return to zero periods can be avoided, in order to facilitate the filtering of that signal.

FIG. 8 shows an example of an embodiment of a circuit making it possible to dispense with the return to zero of the signal applied to the amplifying and filtering circuit 28. In FIG. 8, the processing circuit 21 is connected through the output 29 of the first counter 12 to the digital-to-analog converter 13, as has been shown in FIGS. 5 and 7; the output 16 of the digital-to-analog converter 13 is connected to a field effect transistor T1, whose output is connected, on the one hand, to a capacitor C and, on the other hand, to the input of the amplifying and filtering circuit 28. The capacitor C is connected to ground, and the base 40 of the field effect transistor T1 is connected through a resistor 41 to an interface circuit 42 connected to the output 30 of the memory 27 of the processing circuit 21. Operation is as follows: during the time t corresponding to the counting time of the second counter 14 of the processing circuit 21, the memory 27 transmits, at the output 30, a signal "1," which is applied to the interface circuit 42; the field effect transistor T1 receives, on its base 40, and through the interface circuit 42, a control signal and becomes conductive, the field effect transistor T1 having a very small series impedance; the capacitor C is charged, or discharged up to the output voltage of the digital-to-analog converter through a short RC time constant, R being the output impedance of the digital-to-analog converter, that impedance being small and of the order of a few ohms. During the time t', t'', t''', when the output of the memory is a "0" signal, the field effect transistor T1 is blocked and has a very high series impedance. The capacitor C can discharge only across the input of the amplifying and filtering circuit 28, whose input impedance R is high, namely, a few megohms. A charging time constant RC which is as small as possible, namely of the order of micro-seconds, for example, and a discharge time constant RC which is as large as possible and, for example, greater than 10 times the time t'max for the counting of the first counter, will be assumed, that time constant, i.e., t'max, being, in the example given in the description of the transmission part, 22.4 microseconds.

Figure 10:
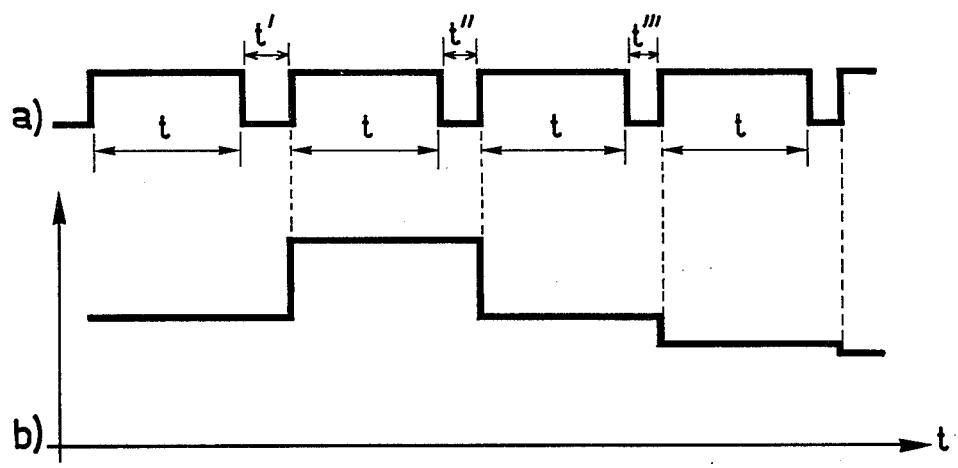
FIG. 10 shows signal waveforms at the input of the amplifying and filtering circuit of FIGS. 8 and 9.

The waveform b in FIG. 10 shows the signals applied to the input of the amplifying and filtering circuit 28; the waveform a is identical to the waveform e in FIG. 6. That waveform b shows that the stages of the signal last, respectively, t + t', t + t'', t + t''' time intervals etc; no return to zero occurs any longer, as in the case of the waveform h in FIG. 6.

Figure 9:
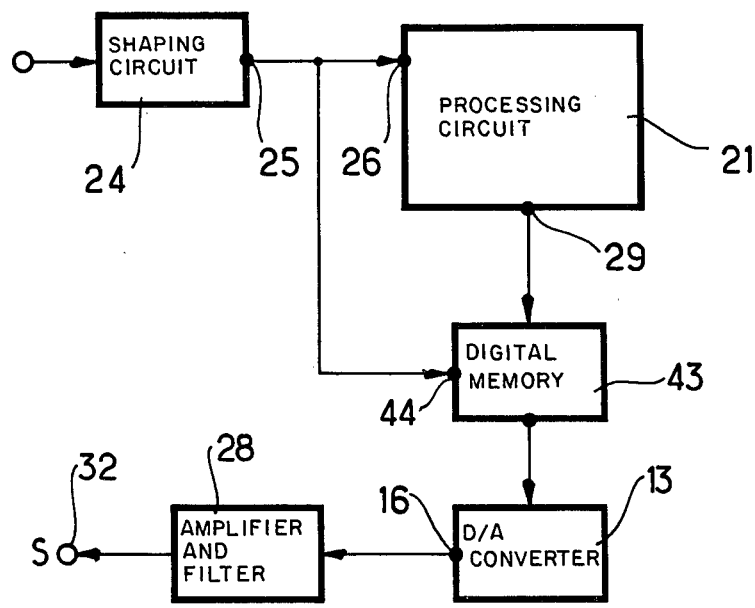
FIG. 9 shows another variant of the embodiment of the receiving or decoder part.

FIG. 9 illustrates another possible embodiment for dispensing with the return to zero of the signal applied to the amplifying and filtering circuit 28.

FIG. 9 shows again the same elements as those shown in FIGS. 5 and 7, namely a forming or shaping circuit 24, a processing circuit 21, a digital-to-analog converter 13, and an amplifying and filtering circuit 28; but a logic memory 43, which is connected, at the input, to the output 29 of the first counter 12 of the processing circuit 21 and at the output, to the input of the digital-to-analog converter 13, has been added; on the other hand, a control input 44 of the logic memory is connected to the output 25 of the forming or shaping circuit 24. When the forming or shaping circuit 24 transmits a signal (see the waveform d in FIG. 6), it allows the writing, into the logic memory 43, of the number displayed by the first counter 12 of the processing circuit 21; the logic memory displays 43 stores that number, and the digitalto-analog converter then transmits a constant signal. When the forming or shaping circuit 24 furnishes another signal, it allows the writing, into the logic memory 43, of the number displayed by the first counter, that number being different, or not different from the number previously displayed by the first counter, and the digital-to-analog converter 13 transmits consequently a constant signal. Thus, a signal such as shown as the waveform b in FIG. 10, in which the return-to-zero portions have been dispensed with, will be found again at the output of the digital-to-analog converter 13, and hence at the input of the amplifying and filtering circuit 28.

Applications are found for the present invention in the transmission or encoding of data of all kinds which are in analog form; it is applied to great advantage, for example, to telephone transmissions circuits.

It must be understood that the invention is not limited to the examples or embodiments described and illustrated, and without deviating beyond the scope of the invention, any means described or illustrated could be replaced by equivalent means.

We claim:

1. A transmission system for translating an analog input signal having a fundamental frequency into an encoded signal and for decoding said encoded signal into an analog output signal, said system comprising:
    an encoder station comprising:
    a. a signal comparator means for comparing the analog input signal with an analog comparison signal,
    b. a memory means for storing a first value until the analog comparison signal reaches a point of equality with the analog input signal and a second value upon the analog comparison signal reaching the point of equality,
    c. a clock generating means for generating clock signal pulses having a relatively high frequency compared to the fundamental frequency of the analog input signal,
    d. a signal counting means for counting the clock signal until the analog comparison signal reaches the point of equality with the analog input signal, for counting the clock signal from the point of equality up to a predetermined number of counts, and for resetting the memory means to the first value when the predetermined number of counts has been reached,
    e. a signal generating means for generating the analog comparison signal from the counted clock signal, said analog comparison signal increasing from zero until the point of equality, remaining constant from the point of equality up to the predetermined number of counts having been reached and falling to zero, and
    f. means including a modulo-two counting means for counting in a modulo two fashion the changes from the second value to the first value of the memory means and for delivering an encoded signal, and
    a decoder station comprising:
    means for receiving said encoded signal and for producing an analog output signal corresponding to the input analog signal.

2. The system according to claim 1 wherein said means for producing the encoded signal further comprises filter means for filtering a rectangular signal delivered by the modulo two counting means, the latter filtered signal constituting the encoded signal.

3. The system according to claim 1 wherein said means of the decoder station comprises:
    a. a signal shaping means for accepting said encoded signal and for producing pulses at zero crossover points of the encoded signal,
    b. a memory means for storing a first value when a pulse has been applied and for storing a second value when a predetermined number of counts of a clock signal has been reached,
    c. a clock signal generating means for generating a clock signal having the same frequency as the clock signal of the encoder station,
    d. a signal counting means for counting the clock signal when a pulse has been applied to the memory means and up to a predetermined number of counts, for counting the clock signal when the predetermined number of counts has been reached and until the next pulse is applied to the memory means, and for resetting the memory means to the second value when the predetermined number of counts has been reached,
    e. a signal generating means for generating a decoded signal from the counted clock signal, said decoded signal taking a constant value every time that a pulse has been applied to the memory means, said constant value being determined by the count of the clock signal when said predetermined number of counts has been reached and until said pulse is applied to the memory means, and
    f. a filtering means for filtering the decoded signal delivered by the signal generating means and for providing the analog output signal corresponding to the input analog signal.

4. The system according to claim 3 wherein said means for producing the encoded signal further comprises a radio transmitter connected at the output of the modulo two counting means, said modulo-two counting means producing a rectangular signal modulating a radio carrier for radio transmission of said encoded signal, and said decoding station further comprises a radio receiver connected to the input of said shaping means for receiving said encoded signal and for demodulating the rectangular signal from the modulated radio carrier.

5. The system according to claim 3 wherein said decoding station further comprises charge/discharge means having an input terminal connected to the memory means, and interconnected between said filtering means and said signal generating means for being chargeable and dischargeable when said memory means stores the first and second values, respectively, said charge/discharge means having a low charging time constant, and a high discharging time constant relative to said charging time constant.

6. The system according to claim 5 wherein said charge/discharge means comprises a three terminal field effect transistor, and further including a resistor and a capacitor, one of the terminals of said field effect transistor being said input terminal, said resistor being interconnected between said input terminal and said memory means, one of the other terminals of said field effect transistor being connected to said filtering means, one terminal of said capacitor being interconnected between the junction of said filtering means and said one of the other terminals of said field effect transistor, the other terminal of said capacitor being grounded, the remaining terminal of said field effect transistor being connected to said signal generating means, said charge/discharge means further including an interface circuit interconnected between said resistor and said memory means.

7. The system according to claim 3 wherein said decoding station further comprises a logic memory means interconnected between the signal counting means and the signal generating mans, and additionally connected to said shaping means for storing the count of clock signal counted when the predetermined number of counts has been reached and until a pulse is applied to the memory means, said logic memory means being resettable by each of said pulses generated by said shaping means.

* * * * *